United States Patent
Middleton et al.

(10) Patent No.: US 6,366,978 B1
(45) Date of Patent: Apr. 2, 2002

(54) CACHE MEMORY

(75) Inventors: Peter Guy Middleton, Saffron Walden; Michael Thomas Kilpatrick, Cherry Hinton, both of (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 09/434,491

(22) Filed: Nov. 5, 1999

(30) Foreign Application Priority Data

Dec. 8, 1998 (GB) .............................................. 9826970
May 28, 1999 (GB) .............................................. 9912630

(51) Int. Cl.$^7$ ............................................. G06F 12/00
(52) U.S. Cl. ..................... 711/108; 711/118; 711/128; 711/163; 365/49; 365/50
(58) Field of Search ................................ 711/108, 128, 711/118, 163, 133, 159; 365/49, 50

(56) References Cited

U.S. PATENT DOCUMENTS 5,530,958 A * 6/1996 Agarwal et al. ................ 711/3
6,101,573 A * 8/2000 Middleton et al. ........... 711/108

* cited by examiner

*Primary Examiner*—Do Hyun Yoo
*Assistant Examiner*—Jasmine Song
(74) *Attorney, Agent, or Firm*—Nixon & Vanderhye P.C.

(57) ABSTRACT

A cache memory system 22 is described in which a content addressable memory 24 and a cache RAM memory 28 are provided. Each content addressable storage row has an associated hit line 18 and an access enable line 12. An index decoder 46 is provided for controlling cache replacement and cache maintenance operations. The hit line 18 is used for passing both hit signals to the cache RAM 28 and select signals generated by the index decoder 46. A gate 36 operating under control of a multiplexer controller 44 controls this dual-use of the hit line 18 in dependence upon a selected mode of operation. In some embodiments a fast block transfer may be performed by loading data from a first address A into the cache memory 22. A match for the TAG value of the first address A could then be performed and the corresponding hit signal asserted and latched within a latch 43. Upon a subsequent cycle the latched hit signal can be passed to an access enable line 12 to permit a new TAG value corresponding to a second address B to be written to the content addressable memory 24. The cached data values from the first address A are now present within the cache memory system 22 associated with a TAG value of the second address B. The dirty bit may be set to ensure that writeback occurs when the data value is removed from the cache memory 22 thereby ensuring data integrity.

16 Claims, 3 Drawing Sheets

CACHE MEMORY

BACKGROUND OF THE INVENTION

Field of the Invention

This invention relates to the field of data processing. More particularly, this invention relates to data processing systems incorporating a cache memory. Cache memories incorporating content addressable memories (CAMs) and associated RAM memories are known within data processing systems. A CAM may be used to provide storage for a TAG within a cache memory system. A CAM allows an input value to be compared in parallel with a plurality of values stored in respective content addressable storage rows within the CAM. If a content addressable storage row is storing a content addressable data word matching the input data value, then a hit signal is generated for that row signalling a match. The hit signal is then used to select a corresponding cache row within the RAM of the cache memory that is storing data values having memory addresses indicated by the TAG value.

Another part of a cache memory is the victim select circuitry that controls which cache data is to be removed from the cache memory when new cache data needs to be stored into the cache memory and the cache memory is already full. Various victim selection strategies are known, such as random, least recently used and round-robin.

A constant aim within data processing systems is to reduce the size of the circuits. This increases speed, reduces cost and reduces power consumption as well as providing other advantages.

SUMMARY OF THE INVENTION

Viewed from one aspect the present invention provides apparatus for processing data having a cache memory, said cache memory comprising:

(i) a plurality of content addressable storage rows, each content addressable storage row containing a plurality of content addressable bit storage cells and serving to store a content addressable data word;

(ii) a plurality of bit lines connecting corresponding content addressable bit storage cells in different content addressable storage rows such that an input data word on said plurality of bit lines is compared in parallel with the contents of each connected content addressable storage row;

(iii) a plurality of hit lines, each content addressable storage row having an associated hit line upon which a hit signal is asserted if said input data word matches a content addressable data word stored within said content addressable storage row;

(iv) a plurality of cache data rows each storing a row of cache data, said content addressable memory serving to store address data to identify memory addresses for corresponding rows of cache data such that a hit signal generated on a hit line in said content addressable memory enables access to a corresponding cache data row within said cache memory; and (v) an index decoder for decoding an index value to generate a select signal for selecting a content addressable storage row and a cache data row for replacement within said cache memory; wherein (vi) said select signal is passed to said cache data row via a corresponding one of said hit lines.

It is known within cache memory systems to provide signal lines running across each content addressable storage row. These may be a hit line for indicating a match with a TAG value, a write enable for enabling writing to a content addressable storage row and a corresponding cache data row, and a read enable to enable reading from a content addressable storage row. Either the hit signal or the read enable signal needs to be passed to a cache data row and so a multiplexer is typically provided between the CAM and the cache RAM to select one of these signals to be passed to the RAM. Such a multiplexer may be on the critical path limiting the maximum speed of operation of the cache memory and accordingly its presence is disadvantageous. A further disadvantage of this known arrangement is that the three separate signal lines passing across the content addressable storage row limit the minimum size that can be achieved for the content addressable storage row.

The present invention recognises both of the above problems and realises that they may be overcome by using the hit line traversing the content addressable storage row to also pass a victim select signal to a victim cache data row. This can reduce the number of signal lines passing across each content addressable storage row from three to two and remove a multiplexer from the critical path.

In preferred embodiments of the invention access enable lines are also provided across each content addressable storage row to provide access to the contents of the content addressable memory when it is desired that this should be independent of any signal upon the hit line.

The content addressable memory may also have valid and dirty bits associated with each row and in this circumstance it is desirable that a selectable connection is provided for coupling a hit signal to enable access to any relevant valid and dirty bit in a matching row.

Viewed from another aspect the present invention provides a method of processing data using a cache memory, said comprising method comprising the steps of:

(i) storing content addressable data words within a plurality of content addressable storage rows, each content addressable storage row containing a plurality of content addressable bit storage cells;

(ii) connecting corresponding content addressable bit storage cells in different content addressable storage rows with a plurality of bit lines such that an input data word on said plurality of bit lines is compared in parallel with the contents of each connected content addressable storage row;

(iii) providing a plurality of hit lines, each content addressable storage row having an associated hit line upon which a hit signal is asserted if said input data word matches a content addressable data word stored within said content addressable storage row;

(iv) providing a plurality of cache data rows each storing a row of cache data, said content addressable memory serving to store address data to identify memory addresses for corresponding rows of cache data such that a hit signal generated on a hit line in said content addressable memory enables access to a corresponding cache data row within said cache memory; and (v) providing an index decoder for decoding an index value to generate a select signal for selecting a content addressable storage row and a cache data row for replacement within said cache memory; wherein (vi) said select signal is passed to said cache data row via a corresponding one of said hit lines.

The present invention may also be used to address the problem of increasing processing speed when a block transfer of data from one memory location to another memory location is required with that data then being used from the new location. Known systems have required the data to be read from the main memory to the processor, written back from the processor to the new address within the main memory and finally read from the main memory or processor back to the cache memory with the associated TAG for the new memory location ready for further use. This is a relatively slow process.

Viewed from another aspect the present invention provides apparatus for processing data having a cache memory, said cache memory comprising:

(i) a plurality of content addressable storage rows, each content addressable storage row containing a plurality of content addressable bit storage cells and serving to store a content addressable data word;

(ii) a plurality of bit lines connecting corresponding content addressable bit storage cells in different content addressable storage rows such that an input data word on said plurality of bit lines is compared in parallel with the contents of each connected content addressable storage row;

(iii) a plurality of hit lines, each content addressable storage row having an associated hit line upon which a hit signal is asserted if said input data word matches a content addressable data word stored within said content addressable storage row;

(iv) a plurality of access enable lines, each content addressable storage row having an associated access enable line upon which an access signal may be asserted to allow a content addressable data word stored within said content addressable storage row to be accessed;

(v) a plurality of cache data rows each storing a row of cache data, said content addressable memory serving to store address data to identify memory addresses for corresponding rows of cache data such that a hit signal generated on a hit line in said content addressable memory enables access to a corresponding cache data row within said cache memory;

(vi) wherein, in an access mode, a connection is provided between a hit line for a content addressable storage row and an access enable line for that content addressable storage row such that an input data word on said bit lines can be compared with said content addressable data words within said plurality content addressable storage rows and if a match occurs for a content addressable storage row generating a hit signal to enable access to that row by passing said hit signal to serve as an access enable signal upon an access enable line.

Providing a connection between the hit signal line and the access enable signal line allows the data stored within the content addressable memory to be manipulated even when its location within the content addressable memory is not known, i.e. the content addressable memory can first be searched to find the data item in question to generate a hit signal and then this hit signal be redirected to provide access for manipulation to the relevant row within the content addressable memory. This feature allows the data stored within a content addressable memory to be manipulated in situ in a manner not previously possible. One example of such a manipulation is to modify the TAG value associated with a row of cache data while the cache data is still stored within the cache memory RAM. More specifically, words from a first memory location can be read to the cache memory, the TAG value stored within the content addressable memory found and modified to point to a second memory location and the cache words directly from the cache memory using their associated second memory address without having to first be written back to the main memory. The dirty bit associated with a cache memory row that is so modified can be set to ensure that when the cache data is removed from the cache memory it is written back to the main memory such that the integrity of the system is maintained.

Viewed from a further aspect the invention provides a method of processing data using a content addressable memory, said method comprising the steps of:

(i) storing content addressable data words within a plurality of content addressable storage rows, each content addressable storage row containing a plurality of content addressable bit storage cells;

(ii) connecting corresponding content addressable bit storage cells in different content addressable storage rows with a plurality of bit lines such that an input data word on said plurality of bit lines is compared in parallel with the contents of each connected content addressable storage row;

(iii) providing a plurality of hit lines, each content addressable storage row having an associated hit line upon which a hit signal is asserted if said input data word matches a content addressable data word stored within said content addressable storage row;

(iv) providing a plurality of access enable lines, each content addressable storage row having an associated access enable line upon which an access signal may be asserted to allow a content addressable data word stored within said content addressable storage row to be accessed;

(v) wherein, in an access mode, a connection is provided between a hit line for a content addressable storage row and an access enable line for that content addressable storage row such that an input data word on said bit lines can be compared with said content addressable data words within said plurality content addressable storage rows and if a match occurs for a content addressable storage row generating a hit signal to enable access to that row by passing said hit signal to serve as an access enable signal upon an access enable line.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
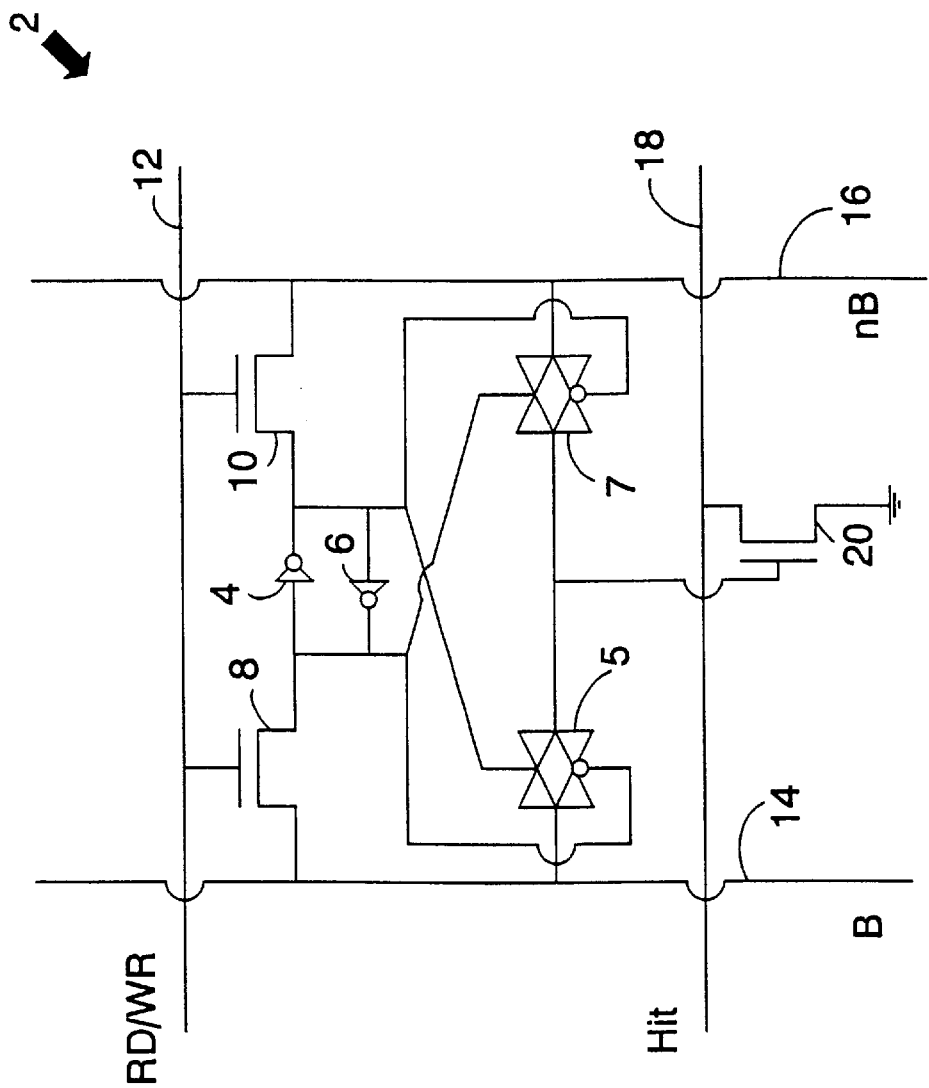
FIG. 1 illustrates a content addressable memory cell.

FIG. 1 shows a content addressable memory cell 2. A bit value is stored by two invertors 4, 6. Gating transistors 8, 10 provide access control to the invertors 4, 6. When the gating transistors 8, 10 are turned on by an access enable signal RD/WR on the access enable signal line 12, then bit values on the bit lines 14, 16 (complementary values) are passed to or read from the invertors 4, 6 via transmission gates 5, 7.

During a comparison operation, an input data word is applied to the bit line pairs 14, 16 and compared in parallel within each of the content addressable memory rows with the data value stored by all the invertors 4, 6, making up that row. The hit lines 18 for each row are precharged high. If a memory cell 2 does not contain a matching bit to that input upon the bit line pairs 14, 16, then the transistor 20 is turned on so discharging the associated hit line 18. Accordingly, if any content addressable memory row is storing a value for which all of the bits match the input data word, then its hit line 18 will remain at the precharged high value and this then serves as a hit signal indicating the match. A single non-matching bit within a row results in a discharge of the hit line for that row. When the content addressable memory cell 2 is not being accessed for a read or write, the bit lines 14, 16 are both driven to zero. One of the transmission gates 5, 7 will then be enabled, but the transistor 20 will not be enabled and so the hit line 18 will remain precharged.

Figure 2:
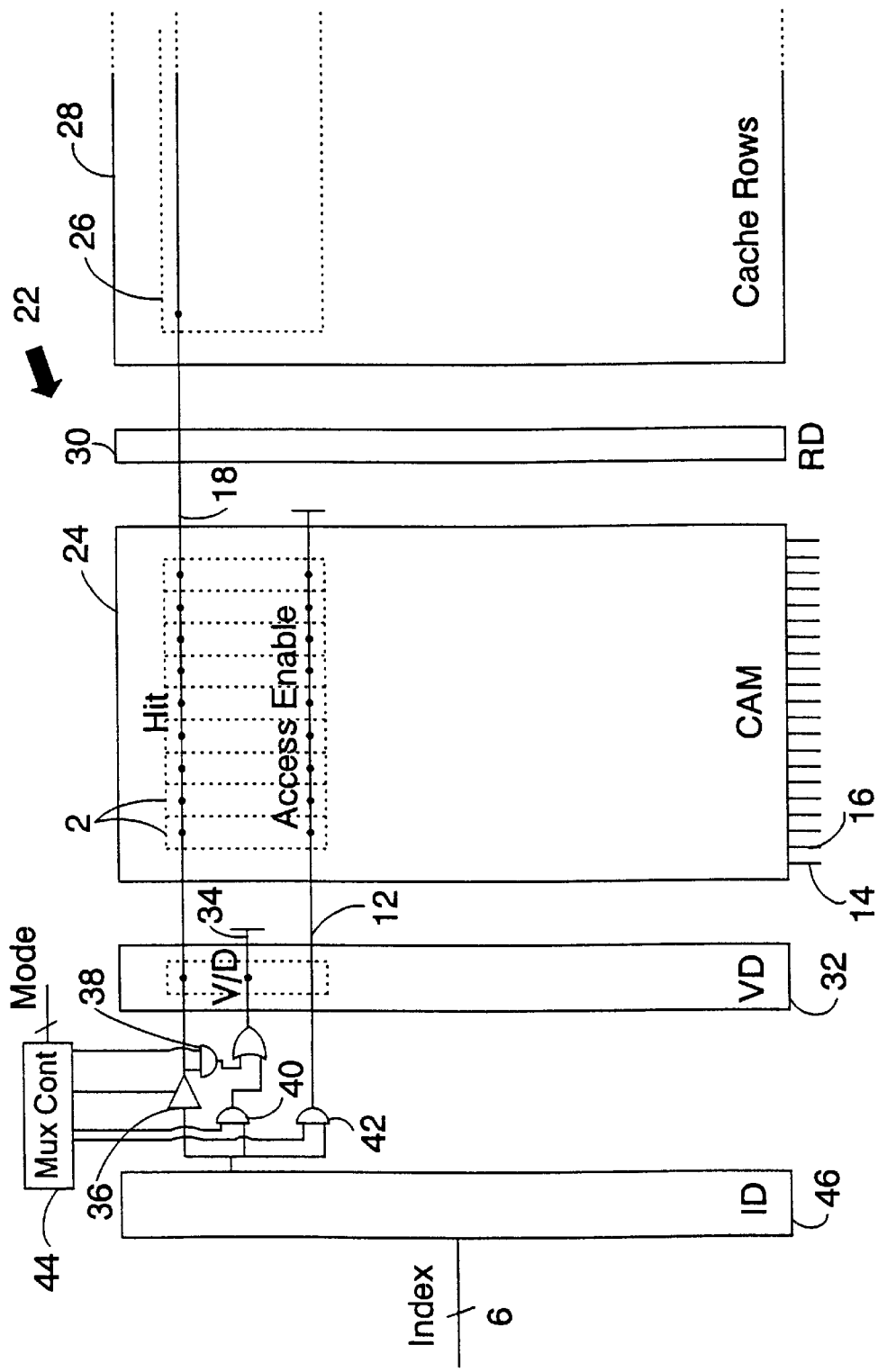
FIG. 2 illustrates a cache memory incorporating a content addressable memory according to a first embodiment.

FIG. 2 illustrates a first embodiment of a cache memory system 22. A content addressable memory 24 stores TAG values indicating the memory addresses of data values stored within corresponding cache memory rows 26 of the cache RAM block 28. Each content addressable storage row is formed of a plurality of content addressable memory cells 2. In FIG. 2, a single row is schematically illustrated greatly vertically expanded.

A column of row drivers 30 are provided between the content addressable memory 24 and the cache RAM block 28. These are enabled at a time such that all the hit lines corresponding to non-matching rows will have discharged before any single remaining hit signal is passed to a row within the cache RAM block 28. A block of bit storage cells 32 storing valid and dirty bits associated with each row of the content addressable memory 24 and the cache RAM block 28 are also provided. The valid bit indicates that the row is storing valid data, as compared to at start-up when whatever values may be present within the system are not valid. The dirty bit is used in a writeback system to indicate that a cached value has been changed and needs to be written back to the main memory when it is flushed (removed) from the cache system.

Each row has an associated hit line 18 and access enable line 12. There is a further valid/dirty access enable line 34 for providing access to the valid/dirty bit block 32. A plurality of switchable buffers (e.g. AND gates) 36, 38, 40, 42 controlled by a multiplexer controller 44 serve to provide various interconnections between the hit line 18, the access enable line 12, the valid/dirty access enable line 34 and the output of an index decoder 46. The multiplexer controller 44 is responsive to an input mode signal Mode to select which of the gates 36, 38, 40 and 42 will be open and which will be closed in any given mode.

The index decoder 46 is responsive to an input index value to decode this and select one of the rows into which a new set of data values are to be written, e.g. to provide victim select.

In normal operation, when a read is to be made from the cache system 22, a portion of the virtual address value is applied to the content addressable memory 24 and compared in parallel to the TAG values stored within each content addressable storage row. If a match occurs, then a hit signal on the hit line 18 is generated for that row and is passed via the row driver block 30 to the cache RAM block 28. The cache row within the cache RAM block 28 is then read. During this operation all of the gates 36, 38, 40 and 42 may be closed.

When a write to a cache memory location takes place, then a similar comparison of the virtual address occurs within the content addressable memory 24 to generate a hit signal enabling write access within the cache row of the cache RAM block 28. In this case, the multiplexer controller 44 is responsive to the write mode to enable gate 38 to pass the hit signal so as to set the dirty bit for the row indicating that the value stored within that row has been changed and requires writing back to the main memory (not shown) in due course.

When a new value is being written to a content addressable storage row and a cache row, then the index decoder 46 selects the victim row using an index value from a victim generator circuit (not shown) e.g. a 6-bit random number. The gate 36 serves to pass the victim signal from the victim select circuit onto the hit line 18 to enable access to the corresponding cache data row. The gate 42 passes the victim select circuit to the access enable line 12 to enable the input data value upon the bit line pairs 14, 16 to be written to the content addressable storage row. The gate 40 is open to pass the victim select signal to set the valid bit for the row and reset the dirty bit.

In cache maintenance operations, such as cache clean and invalidate, there are two approaches that can be taken.

1. A portion of the virtual address is applied to the content addressable memory 24 and compared in parallel to the TAG values stored within each content addressable storage row. If a match occurs, then a hit signal on the hit line 18 is generated for that row and passed via gate 38 to the valid/dirty signal line 34. The valid and dirty bits are read, and if valid and dirty, then the signal on the hit line 18 is passed via the row driver block 30 to the cache RAM block 28. The cache data values for that row are then read. The valid and dirty bits are then written appropriately to reset the dirty bit and/or the valid bit, dependent upon whether a clean and/or invalidate operation is taking place.

2. The row can be selected by the index decoder 46. As before, the index select signal is passed onto the valid/dirty signal line 34 via gate 40 and the valid and dirty bits read. If valid and dirty, then the index select signal is passed via gate 36 to the hit line, and via the row driver block 30 to the cache RAM block 28. Cache data values for that row are then read. The valid and dirty bits are then written appropriately for clean and/or invalidate operations.

In a diagnostic mode, such as a CAM read/write and/or a RAM read/write, then the system may operate in either of the modes described below.

1. The row is selected by the index decoder 46. The decoded index value is passed to the valid/dirty signal line 34 via gate 40 to the access enable signal line 12 via gate 42. The valid and dirty bits and the TAG held in the CAM for that row can then be read or written.

2. The row is selected by the index decoder 46. The decoded index value is passed on to the hit line 18 via gate 36 and via the row driver block 30 to the cache RAM block 28. The cache data word stored with in the cache RAM block 28 can then be read or written.

Figure 3:
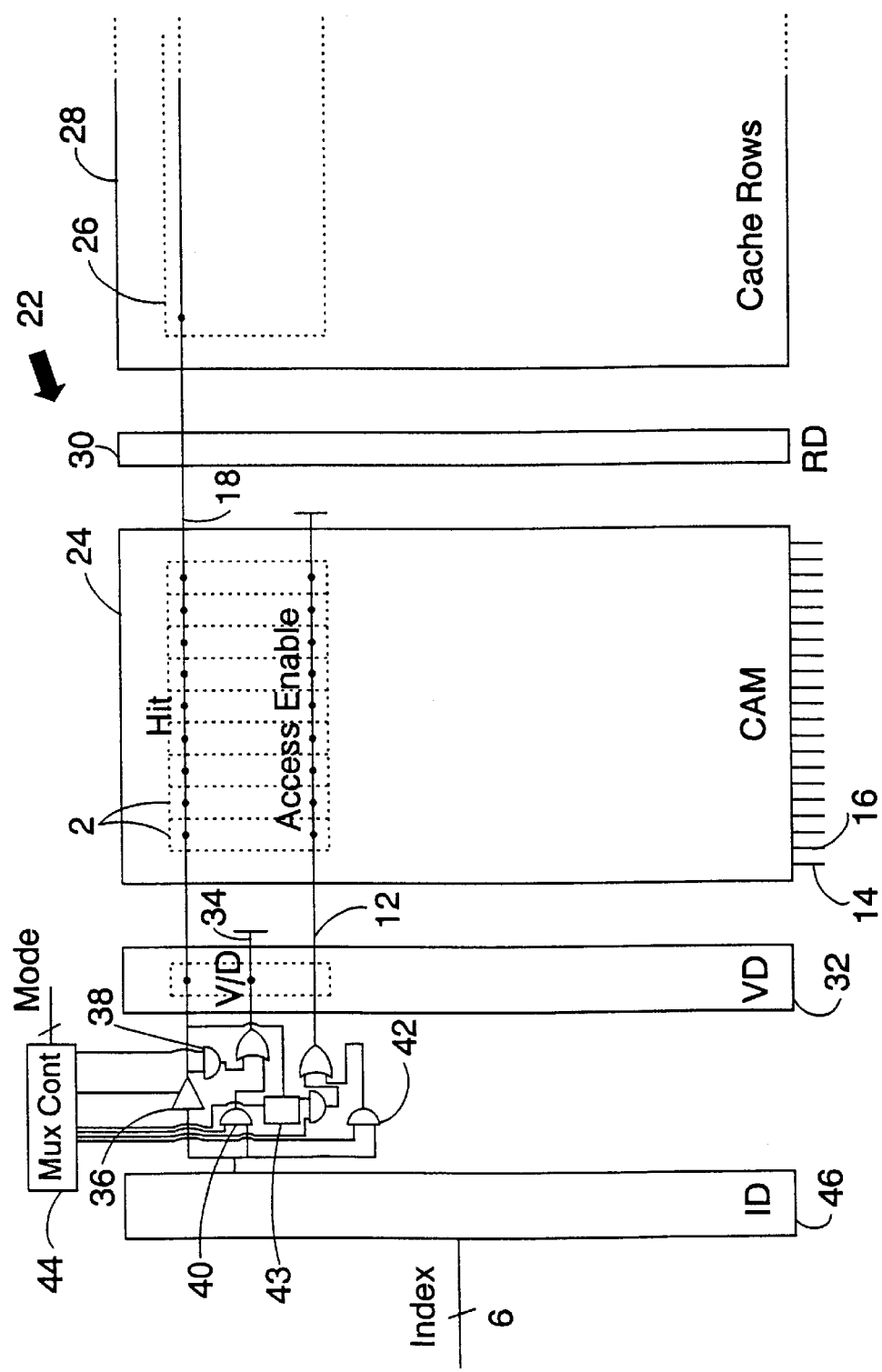
FIG. 3 illustrates a cache memory incorporating a content addressable memory according to a second embodiment.

FIG. 3 illustrates a second embodiment of a cache memory system 22. This is a unified cache with writeback supported with the TAG value read out of the CAM 24 being used for writeback.

When it is desired to perform a block transfer of data then the following method may be used.

1. Linefill from a first address A (a LOAD from address A will be sufficient to initiate the linefill).

2. Perform a co-processor instruction to modify the TAG value for the row that has just been written to point to a second address B within the main memory and mark the cache row as dirty in the valid/dirty block 32 to ensure that a writeback will subsequently occur.

3. The new data is now within the cache associated with the second address B and can be used directly. In the case of self-modifying code, the code can be modified within the cache at the new address. The integrity of the main memory is ensured by the "dirty" data being written back to the external main memory when it is removed from the cache in due course.

The operation of the system in response to the co-processor instruction would be first to find the matching row within the CAM 24 storing a TAG value matching the first address A. A hit signal for the matching row would then be asserted on the hit line 18 and latched by a latch 43. In a subsequent clock cycle the latch 43 would be enabled to drive its output onto the access enable signal line 12 to allow a new second address value B asserted upon the bit line pairs 14, 16 to be written to the CAM cells 2 of the row concerned. The operation performed in response to the co-processor instruction would typically take approximately five clock cycles to complete.

This sequence of:
1. Linefill of 8 words from address A;
2. Co-processor instruction to change TAG from address A to address B;

is significantly shorter/faster than:
1. Load 8 words to the processor from address A (equivalent to a linefill of 8 words);
2. Store the 8 words to address B;
3. Linefill of 8 words from address B.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data having a cache memory, said cache memory comprising:
    (i) a plurality of content addressable storage rows, each content addressable storage row containing a plurality of content addressable bit storage cells and serving to store a content addressable data word;
    (ii) a plurality of bit lines connecting corresponding content addressable bit storage cells in different content addressable storage rows such that an input data word on said plurality of bit lines is compared in parallel with the contents of each connected content addressable storage row;
    (iii) a plurality of hit lines, each content addressable storage row having an associated hit line upon which a hit signal is asserted if said input data word matches a content addressable data word stored within said content addressable storage row;
    (iv) a plurality of cache data rows each storing a row of cache data, said content addressable memory serving to store address data to identify memory addresses for corresponding rows of cache data such that a hit signal generated on a hit line in said content addressable memory enables access to a corresponding cache data row within said cache memory; and
    (v) an index decoder for decoding an index value to generate a select signal for selecting a content addressable storage row and a victim cache data row for replacement within said cache memory; wherein
    (vi) said select signal is passed to said cache data row via a corresponding one of said hit lines.

2. Apparatus for processing data as claimed in claim 1, comprising a plurality of access enable lines, each content addressable storage row having an associated access enable line upon which an access signal may be asserted to allow a content addressable data word stored within said content addressable storage row to be accessed.

3. Apparatus as claimed in claim 1, wherein a valid bit is associated with each content addressable memory row for indicating whether said content addressable memory row is storing valid data.

4. Apparatus as claimed in claim 3, comprising a selectable connection for passing said hit signal to enable access to said valid bit.

5. Apparatus as claimed in claim 1, wherein a dirty bit is associated with each content addressable memory row for indicating whether said cache data corresponding to said content addressable memory row has been changed since being written to said cache memory.

6. Apparatus as claimed in claim 5, comprising a selectable connection for passing said hit signal to enable access to said dirty bit.

7. A method of processing data using a cache memory, said method comprising the steps of:
    (i) storing content addressable data words within a plurality of content addressable storage rows, each content addressable storage row containing a plurality of content addressable bit storage cells;
    (ii) connecting corresponding content addressable bit storage cells in different content addressable storage rows with a plurality of bit lines such that an input data word on said plurality of bit lines is compared in parallel with the contents of each connected content addressable storage row;
    (iii) providing a plurality of hit lines, each content addressable storage row having an associated hit line upon which a hit signal is asserted if said input data word matches a content addressable data word stored within said content addressable storage row;
    (iv) providing a plurality of cache data rows each storing a row of cache data, said content addressable memory serving to store address data identify memory addresses for corresponding rows of cache data such that a hit signal generated on a hit line in said content addressable memory enables access to a corresponding cache data row within said cache memory; and
    (v) providing an index decoder for decoding an index value to generate a select signal for selecting a content addressable storage row and a cache data row for replacement within said cache memory; wherein
    (vi) said select signal is passed to said cache data row via a corresponding one of said hit lines.

8. Apparatus for processing data having a cache memory, said cache memory comprising:
    (i) a plurality of content addressable storage rows, each content addressable storage row containing a plurality of content addressable bit storage cells and serving to store a content addressable data word;
    (ii) a plurality of bit lines connecting corresponding content addressable bit storage cells in different content addressable storage rows such that an input data word on said plurality of bit lines is compared in parallel with the contents of each connected content addressable storage row;

(iii) a plurality of hit lines, each content addressable storage row having an associated hit line upon which a hit signal is asserted if said input data word matches a content addressable data word stored within said content addressable storage row;

(iv) a plurality of access enable lines, each content addressable storage row having an associated access enable line upon which an access signal may be asserted to allow a content addressable data word stored within said content addressable storage row to be accessed;

(v) a plurality of cache data rows each storing a row of cache data, said content addressable memory serving to store address data identify memory addresses for corresponding rows of cache data such that a hit signal generated on a hit line in said content addressable memory enables access to a corresponding cache data row within said cache memory;

(vi) wherein, in an access mode, a connection is provided between a hit line for a content addressable storage row and an access enable line for that content addressable storage row such that an input data word on said bit lines can be compared with said content addressable data words within said plurality content addressable storage rows and if a match occurs for a content addressable storage row generating a hit signal to enable access to that row by passing said hit signal to serve as an access enable signal upon an access enable line.

9. Apparatus as claimed in claim 8, comprising an index decoder for decoding an index value to generate an access enable signal on one of said access enable lines.

10. Apparatus as claimed in claim 9, wherein said index value is used to select a victim for replacement within said content addressable memory.

11. Apparatus as claimed in claim 8, wherein a valid bit is associated with each content addressable memory row for indicating whether said content addressable memory row is storing valid data.

12. Apparatus as claimed in claim 11, wherein said connection also passes said hit signal to enable access to said valid bit.

13. Apparatus as claimed in claim 8, wherein a dirty bit is associated with each content addressable memory row for indicating whether said cache data corresponding to said content addressable memory row has been changed since being written to said cache memory.

14. Apparatus as claimed in claim 13, wherein said connection also passes said hit signal to enable access to said dirty bit.

15. Apparatus as claimed in claim 13, wherein said data processing apparatus is responsive to a data processing instruction to use said access mode to:

(i) identify a cache row storing cache data associated with first address data stored in a corresponding content addressable storage row;

(ii) store second address data in place of said first address data in said content addressable storage row; and (iii) mark as dirty said cache data; such that (iv) said cache data can be accessed from said cache memory using said second address data and said cache data is written back to a main memory location indicated by said second address data when said cache data is flushed from said cache memory thereby effecting a transfer of said cache data from a main memory location indicated by said first address data to a main memory location indicated by said second address data.

16. A method of processing data using a content addressable memory, said method comprising the steps of:

(i) storing content addressable data words within a plurality of content addressable storage rows, each content addressable storage row containing a plurality of content addressable bit storage cells;

(ii) connecting corresponding content addressable bit storage cells in different content addressable storage rows with a plurality of bit lines such that an input data word on said plurality of bit lines is compared in parallel with the contents of each connected content addressable storage row;

(iii) providing a plurality of hit lines, each content addressable storage row having an associated hit line upon which a hit signal is asserted if said input data word matches a content addressable data word stored within said content addressable storage row;

(iv) providing a plurality of access enable lines, each content addressable storage row having an associated access enable line upon which an access signal may be asserted to allow a content addressable data word stored within said content addressable storage row to be accessed;

(v) wherein, in an access mode, a connection is provided between a hit line for a content addressable storage row and an access enable line for that content addressable storage row such that an input data word on said bit lines can be compared with said content addressable data words within said plurality content addressable storage rows and if a match occurs for a content addressable storage row generating a hit signal to enable access to that row by passing said hit signal to serve as an access enable signal upon an access enable line.

* * * * *